United States Patent [19]

Merchant

[11] Patent Number: 5,034,149
[45] Date of Patent: Jul. 23, 1991

[54] BINARY AZEOTROPIC COMPOSITIONS OF 3-CHLORO-1,1,1-TRIFLUOROPROPANE WITH METHANOL OR ETHANOL, OR TRANS-1,2-DICHLOROETHYLENE

[75] Inventor: Abid N. Merchant, Wilmington, Del.

[73] Assignee: E. I. Du Pont de Nemours and Company, Wilmington, Del.

[21] Appl. No.: 496,915

[22] Filed: Mar. 21, 1990

[51] Int. Cl.$^5$ .................. C11D 7/30; C11D 7/50; C09K 3/30; C23G 5/028
[52] U.S. Cl. .................................... 252/171; 134/12; 134/38; 134/39; 134/40; 252/67; 252/162; 252/170; 252/305; 252/364; 252/DIG. 9; 424/45; 521/131
[58] Field of Search ............. 252/DIG. 9, 67, 69, 252/162, 170, 171, 364, 305; 134/12, 38, 39, 40; 521/131; 424/45

[56] References Cited

U.S. PATENT DOCUMENTS

| | | | |
|---|---|---|---|
| 2,999,815 | 9/1961 | Eiseman | 252/171 |
| 2,999,816 | 9/1961 | Bennett et al. | 252/171 |
| 3,881,949 | 5/1975 | Brock | 134/31 |
| 3,903,009 | 9/1975 | Bauer et al. | 252/171 |
| 4,482,465 | 11/1984 | Gray | 252/67 |
| 4,767,561 | 8/1988 | Gorski | 252/171 |
| 4,795,763 | 1/1989 | Gluck et al. | 521/99 |

FOREIGN PATENT DOCUMENTS 1-304194  12/1989  Japan ..................... 252/364

Primary Examiner—Paul Lieberman
Assistant Examiner—Linda D. Skaling

[57] ABSTRACT

Azeotropic mixtures of 3-chloro-1,1,1-trifluoropropane (HCFC-253fb) with methanol, ethanol, or trans-1,2-dichloroethylene (t-HCC-1130) are useful in solvent cleaning applications.

16 Claims, No Drawings

BINARY AZEOTROPIC COMPOSITIONS OF 3-CHLORO-1,1,1-TRIFLUOROPROPANE WITH METHANOL OR ETHANOL, OR TRANS-1,2-DICHLOROETHYLENE

BACKGROUND OF THE INVENTION

As modern electronic circuit boards evolve toward increased circuit and component densities, thorough board cleaning after soldering becomes a more important criterion. Current industrial processes for soldering electronic components to circuit boards involve coating the entire circuit side of the board with flux and thereafter passing the flux-coated board over preheaters and through molten solder. The flux cleans the conductive metal parts and promotes solder fusion. Commonly used solder fluxes generally consist of rosin, either used alone or with activating additives, such as amine hydrochlorides or oxalic acid derivatives.

After soldering, which thermally degrades part of the rosin, the flux-residues are often removed from the circuit boards with an organic solvent. The requirements for such solvents are very stringent. Defluxing solvents should have the following characteristics: a low boiling point, be nonflammable, have low toxicity and have high solvency power, so that flux and flux-residues can be removed without damaging the substrate being cleaned.

While boiling point, flammability and solvent power characteristics can often be adjusted by preparing solvent mixtures, these mixtures are often unsatisfactory because they fractionate to an undesirable degree during use. Such solvent mixtures also fractionate during solvent distillation, which makes it virtually impossible to recover a solvent mixture with the original composition.

On the other hand, azeotropic mixes, with their constant boiling points and constant compositions, have been found to be very useful for these applications. Azeotropic mixtures exhibit either a maximum or minimum boiling point and they do not fractionate on boiling. These characteristics are also important when using solvent compositions to remove solder fluxes and flux-residues from printed circuit boards. Preferential evaporation of the more volatile solvent mixture components would occur, if the mixtures were not azeotropic and would result in mixtures with changed compositions, and with less-desirable solvency properties, such as lower rosin flux solvency and lower inertness toward the electrical components being cleaned. The azeotropic character is also desirable in vapor degreasing operations, where redistilled solvent is generally employed for final rinse cleaning.

In summary, vapor defluxing and degreasing systems act as a still. Unless the solvent composition exhibits a constant boiling point, i.e., is a single material, or is azeotropi, fractionation will occur and undesirable solvent distribution will result, which could detrimentally affect the safety and efficacy of the cleaning operation.

A number of halocarbon based azeotropic compositions have been discovered and in some cases used as solvents for solder flux and flux-residue removal from printed circuit boards and also for miscellaneous degreasing applications. For example: U.S. Pat. No. 3,903,009 discloses the ternary azeotrope of 1,1,2-trichloro-1,2,2-trifluorethane with ethanol and nitromethane; U.S. Pat. No. 2,999,815 discloses the binary azeotrope of 1,1,2-trichloro-1,2,2-trifluoroethane and acetone; U.S. Pat. No. 2,999,816 discloses the binary azeotrope of 1,1,2-trichloro-1,2,2-trifluoroethane and methylalcohol; U.S. Pat. No. 4,767,561 discloses the ternary azeotrope of 1,1,2-trichloro-1,2,2-trifluoroethane, methanol and 1,2-dichloroethylene.

Such mixtures are also useful as buffing abrasive detergents, e.g., to remove buffing abrasive compounds from polished surfaces such as metal, as drying agents for jewelry or metal parts, as resist-developers in convectional circuit manufacturing techniques employing chlorine-type developing agents, and to strip photoresists (for example, with the addition of a chlorohydrocarbon such as 1,1,1-trichloroethane or trichloroethylene. These mixtures are further useful as refrigerants, heat transfer media, foam expansion agents, aerosol propellants, solvents and power cycle working fluids.

Close-cell polyurethane foams are widely used for insulation purposes in building construction and in the manufacture of energy efficient electrical appliances. In the construction industry, polyurethane (polyisocyanurate) board stock is used in roofing and siding for its insulation and load-carrying capabilities. Poured and sprayed polyurethane foams are also used in construction. Sprayed polyurethane foams are widely used for insulating large structures such as storage tanks, etc. Pour-in-place polyurethane foams are used, for example, in appliances such as refrigerators and freezers plus they are used in making refrigerated trucks and railcars.

All of these various types of polyurethane foams require expansion agents (blowing agents) for their manufacture. Insulating foams depend on the use of halocarbon blowing agents, not only to foam the polymer, but primarily for their low vapor thermal conductivity, a very important characteristic for insulation value. Historically, polyurethane foams are made with CFC-11 (trichlorofluoromethane) as the primary blowing agent.

A second important type of insulating foam is phenolic foam. These foams, which have very attractive flammability characteristics, are generally made with CFC-11 and CFC-113 (1,1,2-trichloro-1,2,2-trifluoroethane) blowing agents.

A third type of insulating foam is thermoplastic foam, primarily polystyrene foam. Polyolefin foams (polyetylene and polypropylene) are widely used in packaging. These thermoplastic foams are generally made with CFC-12.

Many smaller scale hermetically sealed, refrigeration systems, such as those used in refrigerators or window and auto air conditioners, use dichlorodifluoromethane (CFC-12) as the refrigerant. Larger scale centrifugal refrigeration equipment, such as those used for industrial scale cooling, e.g., commercial office buildings, generally employ trichlorofluoromethane (CFC-11) or 1,1,2-trichlorotrifluoroethane (CFC-113) as the refrigerants of choice. Azeotropic mixtures, with their constant boiling points and compositions have also been found to be very useful as substitute refrigerants, for many of these applications.

Aerosol products have employed both individual halocarbons and halocarbon blends as propellant vapor pressure attenuators, in aerosol systems. Azeotropic mixtures, with their constant compositions and vapor pressures would be very useful as solvents and propellants in aerosol systems.

Some of the chlorofluorocarbons which are currently used for cleaning and other applications have been theoretically linked to depletion of the earth's ozone layer. As early as the mid-1970's, it was known that introduction of hydrogen into the chemical structure of previously fully-halogenated chlorofluorocarbons reduced the chemical stability of these compounds. Hence, these now destablized compounds would be expected to degrade in the lower atmosphere and not reach the stratospheric ozone layer in-tact. What is also needed, therefore, are substitute hydrochlorofluorocarbons which have low theoretical ozone depletion potentials.

Unfortunately, as recognized in the art, it is not possible to product the formation of azeotropes. This fact obviously complicates the search for new azeotropic compositions, which have application in the field. Nevertheless, there is a constant effort in thee art to discover new azeotropes, which have desirable solvency characteristics and particularly greater versatilities in solvency power.

SUMMARY OF THE INVENTION

According to the present invention, azeotropic compositions have been discovered comprising admixtures of effective amounts of 3-chloro-1,1,1-trifluoropropane with a compound from the group consisting of methanol, ethanol and trans-1,2-dichloroethylene.

More specifically, the azeotropes are: an admixture of about 90-97 weight percent 3-chloro-1,1,1-trifluoropropane and about 3-10 weight percent methanol; an admixture of about 93-99 weight percent 3-chloro-1,1,1-trifluoropropane and about 1-7 weight percent ethanol; and an admixture of about 55-62 weight percent 3-chloro-1,1,1-trifluoropropane and about 38-45 weight percent trans-1,1-dichloroethylene.

The present invention provides nonflammable azeotropic compositions which are well suited for solvent cleaning applications.

The compositions of the invention can further be used as refrigerants in existing refrigeration equipment, with minor modifications. They are useful in compression cycle applications including air conditioner and heat pump systems for producing both cooling and heating the new refrigerant mixtures can be used in refrigeration applications such as described in U.S. Pat. No. 4,482,465 to Gray.

The composition of the instant invention comprises an admixture of effective amounts of 3-chloro-1,1,1-trifluoropropane ($CF_3-CH_2-CH_2Cl$, boiling point=45.1° C.) with components selected from the group consisting of methanol ($CH_3OH$, boiling point=64.6° C.) or ethanol ($CH_3-CH_2OH$, boiling point=78° C.) or trans-1,2-dichloroethylene ($CHCl=CHCl$, boiling point=47.5° C.) to form azeotropic compositions. The aforementioned halocarbons are known as HCFC-253fb, and t-HCC-1130, respectively, in the nomenclature conventional to the halocarbon field.

By azeotropic composition is meant, a constant boiling liquid admixture of two or more substances, whose admixture behaves as a single substance, in that the vapor, produced by partial evaporation or distillation of the liquid has substantially the same composition as the liquid, i.e., the admixture distills without substantial compositional change. Constant boiling compositions, which are characterized as azeotropic, exhibit either a maximum or minimum boiling point, as compared with that of the nonazeotropic mixtures of the same substances.

By an effective amount is meant the amount of each component of the instant invention admixture which, when combined, results in the formation of the azeotropes of the instant invention.

The language "an azeotropic composition consisting essentially of..." is intended to include mixtures which contain all the components of the azeotrope of this invention (in any amounts) and which, if fractionally distilled, would produce an azeotrope containing all the components of this invention in at least one fraction, alone or in combination with another compounds, e.g., one which distills at substantially the same temperature as said fraction.

It is possible to characterize, in effect, a constant boiling admixture, which may appear under many guises, depending upon the conditions chosen, by any of several criteria:

The composition can be defined as an azeotrope of A and B since the very term "azeotrope" is at once both definitive and limitative, and requires that effective amounts of A and B form this unique composition of matter, which is a constant boiling admixture.

It is well known by those skilled in the art that at different pressures, the composition of a given azeotrope will vary—at least to some degree—and changes in pressure will also change—at least to some degree—the boiling point temperature. Thus an azeotrope of A and B represents a unique type of relationship but with a variable composition which depends on temperature and/or pressure. Therefore compositional ranges, rather than fixed compositions, are often used to define azeotropes.

The composition can be defined as a particular weight percent relationship or mole percent relationship of A and B while recognizing that such specific values point out only one particular such relationship and that in actuality, a series of such relationships, represented by A and B actually exist for a given azeotrope, varied by the influence of pressure.

Azeotrope A and B can be characterized by defining the composition as an azeotrope characterized by a boiling point at a given pressure, thus giving identifying characteristics without unduly limiting the scope of the invention by a specific numerical composition, which is limited by and is only as accurate as the analytical equipment available.

Binary mixtures of about 90-97 weight percent 3-chloro-1,1,1-trifluoropropane and about 3-10 weight percent methanol are characterized as azeotropes, in that mixtures within this range exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture within this range exhibits properties which are characteristic of a true binary azeotrope. The binary composition consisting of about 93.5 weight percent 3-chloro-1,1,1-trifluoropropane and about 6.5 weight percent methanol has been established, within the accuracy of the fractional distillation method, as a true binary azeotrope, boiling at about 41.5° C, at substantially atmospheric pressure.

Also, according to the instant invention, binary mixtures of about 93-99 weight percent 3-chloro-1,1,1-trifluoropropane and about 1-7 weight percent ethanol are characterized as azeotropic. The binary composition consisting of about 96.5 weight percent 3-chloro-1,1,1-trifluoropropane and about 3.5 weight percent ethanol has been established, within the accuracy of the fractional distillation method, as a true binary azeotrope, boiling at about 45.0° C, at substantially atmospheric pressure.

Also, according to the instant invention, binary mixtures of about 55-62 weight percent 3-chloro-1,1,1-trifluoropropane and about 38-45 weight percent trans-1,2-dichloroethylene are characterized as azeotropic. The binary composition consisting of about 58.7 weight percent 3-chloro-1,1,1-trifluoropropane and about 41.3 weight percent trans-1,2-dichloroethylene has been established, within the accuracy of the fractional distillation method, as a true binary azeotrope, boiling at about 43.0° C, at substantially atmospheric pressure.

The aforestated azeotropic compositions have low ozone-depletion potentials and are expected to compose almost completely, prior to reaching the stratosphere.

The azeotropic compositions of the present invention permit easy recovery and reuse of the solvent from vapor defluxing and degreasing operations because of their azeotropic natures. As an example, the azeotropic mixtures of this invention can be used in cleaning processes such as described in U.S. Pat. No. 3,881,949, or as a buffing abrasive detergent.

In addition, the mixtures are useful as resist developers, where chlorine-type developers would be used, and as resist stripping agents with the addition of appropriate halocarbons.

Another aspect of the invention is a refrigeration method which comprises condensing a refrigerant composition of the invention and thereafter evaporating it in the vicinity of a body to be cooled. Similarly, still another aspect of the invention is a method for heating which comprises condensing the invention refrigerant in the vicinity of a body to be heated and thereafter evaporating the refrigerant.

A further aspect of the invention includes aerosol compositions comprising an active agent and a propellant, wherein the propellant is an azeotropic mixture of the invention; and the production of these compositions by combining said ingredients. The invention further comprises cleaning solvent compositions comprising the azeotropic mixtures of the invention.

The azeotropic compositions of the instant invention can be prepared by any convenient method including mixing or combining the desired component amounts. A preferred method is to weigh the desired component amounts and thereafter combine them in an appropriate container.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosure of all applications, patents and publications, cited above and below, are hereby incorporated by reference.

EXAMPLES

Example 1

An ebullioscope is used to determine the composition versus boiling point temperature characteristics for these minimum boiling azeotropes, as follow: 3-chloro-1,1,1-trifluoropropane is placed in the distillation flask and brought to boiling at atmospheric pressure and the boiling point is recorded. Small quantities of the individual binary component (methanol or ethanol or trans-1,2-dichloroethylene) are added to the distillation apparatus. The distillation is allowed to re-equilibrate for 30 minutes or less and the boiling points (vapor and liquid) are noted for that particular mixture composition.

In all three of the above cases, when the mixture temperatures reach the lowest boiling point for the given composition (temperature lower than the boiling points of either pure component), the temperature recorded is that of the azeotrope at the azeotrope composition.

Example 2

In order to verify azeotropic composition, a solution which contained 91.0 weight percent 3-chloro-1,1,1-trifluoropropane and 9.0 weight percent methanol was prepared in a suitable container and mixed thoroughly.

The solution was distilled in a 30 plate Oldershaw distillation column, using about 10:1 reflux to take-off ratio. Head temperatures were read directly to 0.1° C. All temperatures were adjusted to 760 mm pressure. Distillate compositions were determined by gas chromatography. Results obtained are summarized in Table 2.

TABLE 2

| | DISTILLATION OF: (91.0 + 9.0) 3-CHLORO-1,1,1-TRIFLUOROPROPANE (CTFPR) AND METHANOL (MEOH) | | | |
|---|---|---|---|---|
| CUTS | HEAD TEMP., °C. | WT. % DISTILLED OR RECOVERED | PERCENTAGES CTFPR | MEOH |
| 1 | 41.5 | 5.9 | 93.25 | 6.75 |
| 2 | 41.5 | 12.2 | 93.34 | 6.66 |
| 3 | 41.5 | 18.2 | 93.62 | 6.38 |
| 4 | 41.5 | 26.0 | 93.51 | 6.49 |
| 5 | 41.5 | 32.4 | 93.51 | 6.49 |
| 6 | 41.5 | 36.7 | 93.54 | 6.46 |

Analysis of the above data indicates very small differences between head temperatures and distillate compositions, as the distillation progressed. A statistical analysis of the data demonstrates that the true binary azeotrope of 3-chloro-1,1,1-trifluoropropane ad methanol has the following characteristics at atmospheric pressure (99 percent confidence limits):

3-Chloro-1,1,1-trifluoropropane = 93.5 = 0.5 wt. %
Methanol = 6.5 ± 0.5 wt. %
Boiling Point, °C. = 41.5 = 0.0 wt. %

Example 3

In order to verify azeotropic composition, a solution which contained 80.3 weight percent 3-chloro-1,1,1-trifluoropropane and 19.7 weight percent ethanol was prepared in a suitable container and mixed thoroughly.

The solution was distilled in a 30 plate Olershaw distillation column, using about a 10:1 reflux to take-off ratio. Head temperatures were read directly to 0.1° C. All temperatures were adjusted to 760 mm pressure.

Distillate compositions were determined by gas chromatography. Results obtained are summarized in Table 3.

TABLE 3

DISTILLATION OF:
(80.3 + 19.7)
3-CHLORO-1,1,1-TRIFLUOROPROPANE (CTFPR)
AND ETHANOL (ETOH)

| CUTS | HEAD TEMP., °C. | WT. % DISTILLED OR RECOVERED | PERCENTAGES CTFPR | ETOH |
|------|------|------|------|------|
| FORE | 45.0 | 5.2 | 95.96 | 4.04 |
| 1 | 45.0 | 15.4 | 96.58 | 3.42 |
| 2 | 45.0 | 17.9 | 96.59 | 3.41 |
| 3 | 45.0 | 22.4 | 96.54 | 3.46 |
| 4 | 45.0 | 26.4 | 96.59 | 3.41 |
| 5 | 45.0 | 30.2 | 96.35 | 3.65 |
| 6 | 45.0 | 34.5 | 96.48 | 3.52 |

Analysis of the above data indicates very small differences between head temperatures and distillate compositions, as the distillation progressed. A statistical analysis of the data demonstrates that the true binary azeotrope of 3-chloro-1,1,1-trifluoropropane and methanol has the following characteristics at atmospheric pressure (99 percent confidence limits):
3-Chloro-1,1,1-trifluoropropane=96.5±0.4 wt. %
Ethanol=3.5±0.4 wt. %
Boiling Point, °C.=45.0±0.0 wt. %

Example 4

In order to verify azeotropic composition, a solution which contained 60.0 weight percent 3-chloro-1,1,1-trifluoropropane and 40.0 weight percent trans-1,2-dichloroethylene was prepared in a suitable container and mixed thoroughly.

The solution was distilled in a 30 plate Olershaw distillation column, using about a 10:1 reflux to take-off ratio. Head temperatures were read directly to 0.1° C. All temperatures were adjusted to 760 mm pressure. Distillate compositions were determined by gas chromatography. Results obtained are summarized in Table 4.

TABLE 4

DISTILLATION OF:
(60.0 + 40.0)
3-CHLORO-1,1,1-TRIFLUOROPROPANE (CTFPR)
AND TRANS-1,2-DICHLOROETHYLENE (T-DCE)

| CUTS | HEAD TEMP., °C. | WT. % DISTILLED OR RECOVERED | PERCENTAGES CTFPR | T-DCE |
|------|------|------|------|------|
| FORE | 43.0 | 6.8 | 60.11 | 39.89 |
| 1 | 43.0 | 13.8 | 59.60 | 40.40 |
| 2 | 43.0 | 21.4 | 59.33 | 40.67 |
| 3 | 43.0 | 31.8 | 58.26 | 41.74 |
| 4 | 43.0 | 40.0 | 58.45 | 41.55 |
| 5 | 43.0 | 48.7 | 58.14 | 41.86 |
| 6 | 43.0 | 53.5 | 58.21 | 41.79 |
| HEEL | 43.0 | 58.3 | 56.53 | 43.47 |

Analysis of the above data indicates very small differences between head temperatures and distillate compositions, as the distillation progressed. A statistical analysis of the data demonstrates that the true binary azeotrope of 3-chloro-1,1,1-trifluoropropane and methanol has the following characteristics at atmospheric pressure (99 percent confidence limits):
3-Chloro-1,1,1-trifluoropropane=58.7±2.3 wt. %
trans-1,2-Dichloroethylene=41.3±2.3 wt. %
Boiling Point, °C.=43.0±0.0 wt. %

Example 5

Several single sided circuit boards are coated with activated rosin flux and soldered by passing the board over a preheater to obtain a top side board temperature of approximately 200° F. (93° C.) and then through 500 F (260° C.) molten solder. The soldered boards are defluxed separately with the three azeotropic mixtures cited in Examples 2, 3 and 4 above, by suspending a circuit board, first, for three minutes in the boiling sump, which contains the azeotropic mixture, then, for one minute in the rinse sump, which contained the same azeotropic mixture, and finally, for one minute in the solvent vapor above the boiling sump. The boards cleaned in each azeotropic mixture have no visible residue remaining thereon.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. An azeotropic composition consisting essentially of about 90-97 weight percent 3-chloro-1,1,1-trifluoropropane and about 3-10 weight percent methanol, said composition having a boiling point of about 41.5° C. when the pressure on said composition is adjusted to substantially atmospheric pressure.

2. An azeotropic composition consisting essentially of about 93-99 weight percent 3-chloro-1,1,1-tricluoropropane and about 1-7 weight percent ethanol, said composition having a boiling point of about 45.0° C. when the pressure on said composition is adjusted to substantially atmospheric pressure.

3. The azeotropic composition of claim 1, consisting essentially of about 93.5 weight percent 4. The azeotropic composition of claim 5, consisting essentially of about 96.5 weight percent 3-chloro-1,1,1-trifluoropropane and about 3.5 weight percent ethanol.

5. The azeotropic composition of claim 1, consisting essentially of
   about 92-95 weight percent 3-chloro-1,1,1-trifluoropropane and about 5-8 weight percent methanol.

6. The composition of claim 1, consisting of 3-chloro-1,1,1-trifluoropropane ad methanol.

7. The composition of claim 2, consisting essentially of about 95-98 weight percent 3-chloro-1,1,1-trifluoropropane and about 2-5 weight percent ethanol.

8. The composition of claim 2, consisting of 3-chloro-1,1,1-trifluoropropane and ethanol.

9. A process for cleaning a solid surface which comprises treating said surface with an azeotropic composition of claim 1 or claim 2.

10. The process of claim 9, wherein the solid surface is a printed circuit board contaminated with flux and flux-residues.

11. The process of claim 9, wherein said solid surface is a metal.

12. A process for producing refrigeration which comprises evaporating a mixture of claim 1 or claim 2 in the vicinity of a body to be cooled.

13. A process for producing heat, which comprises condensing a composition of claim 1, or claim 2 in the vicinity of a body to be heated.

14. In a process for preparing a polymer foam comprising expanding a polymer with a blowing agent, the improvement wherein the blowing agent is a composition of claim 1 or claim 2.

15. In an aerosol composition comprising a propellant and an active agent, the improvement wherein the propellant is a composition of claim 1 or claim 2.

16. A process for preparing aerosol formulations comprising condensing an active ingredient in an aerosol container with an effective amount of the composition of claim 1 or claim 2 as a propellant.

* * * * *